United States Patent
Lee et al.

(10) Patent No.: US 9,397,659 B2
(45) Date of Patent: Jul. 19, 2016

(54) TOUCH SCREEN PANEL FOR DISPLAY DEVICE AND METHOD OF MANUFACTURING THE SAME

(71) Applicant: LG Display Co., Ltd., Seoul (KR)

(72) Inventors: Namseok Lee, Seoul (KR); Soonsung Yoo, Goyang-si (KR); Chulho Kim, Paju-si (KR); Yunho Kook, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 114 days.

(21) Appl. No.: 13/727,225

(22) Filed: Dec. 26, 2012

(65) Prior Publication Data

US 2014/0110239 A1 Apr. 24, 2014

(30) Foreign Application Priority Data

Oct. 24, 2012 (KR) .................. 10-2012-0118551

(51) Int. Cl.
*G06F 3/044* (2006.01)
*H03K 17/96* (2006.01)

(52) U.S. Cl.
CPC ............ *H03K 17/9622* (2013.01); *G06F 3/044* (2013.01); *G06F 2203/04103* (2013.01); *H03K 2217/96046* (2013.01)

(58) Field of Classification Search
CPC ............... G06F 3/044; H03K 17/9622; H03K 2217/96046
USPC ................... 428/1.4, 98–220; 345/173–174; 257/750, 774, 779
See application file for complete search history.

(56) References Cited

U.S. PATENT DOCUMENTS

| | | | |
|---|---|---|---|
| 6,163,075 A * | 12/2000 | Okushima | 257/759 |
| 2002/0185981 A1* | 12/2002 | Dietz et al. | 315/169.3 |
| 2005/0008863 A1* | 1/2005 | Mimura et al. | 428/409 |
| 2010/0066650 A1* | 3/2010 | Lee et al. | 345/64 |
| 2010/0182255 A1* | 7/2010 | Jeong et al. | 345/173 |
| 2011/0234510 A1* | 9/2011 | Jeong et al. | 345/173 |
| 2011/0318876 A1* | 12/2011 | Lee et al. | 438/113 |
| 2012/0062510 A1* | 3/2012 | Mo et al. | 345/174 |
| 2012/0315383 A1* | 12/2012 | Bright et al. | 427/108 |
| 2012/0327569 A1* | 12/2012 | Park et al. | 361/679.01 |
| 2015/0161962 A1* | 6/2015 | Kung et al. | 345/173 |

FOREIGN PATENT DOCUMENTS

| | | | | |
|---|---|---|---|---|
| CN | 202472601 U | 10/2012 | | |
| JP | 11054702 A * | 2/1999 | | H01L 27/04 |

OTHER PUBLICATIONS

Chinese First Office Action, Chinese Application No. 201210581454.3, Feb. 4, 2016, 13 pages.

* cited by examiner

*Primary Examiner* — Sophie Hon
(74) *Attorney, Agent, or Firm* — Fenwick & West LLP

(57) ABSTRACT

A touch screen panel for a display device includes layers of polymer formed on both sides of a substrate for forming driving electrodes and sensing electrodes. The substrate may be made of materials such as polyethylene terephthalate (PET). Instead of bonding a window cover made of a heavy material, layers or polymer are formed on both sides of the substrate to afford rigidity to the touch screen panel. By removing the window cover, the weight and thickness of the touch screen panel can be reduced.

12 Claims, 10 Drawing Sheets

TOUCH SCREEN PANEL FOR DISPLAY DEVICE AND METHOD OF MANUFACTURING THE SAME

CROSS-REFERENCE TO RELATED APPLICATION

This application claims priority under 35 U.S.C. §119(a) to Korean Patent Application No. 10-2012-0118551 filed on Oct. 24, 2012, which is incorporated by reference herein in its entirety.

BACKGROUND

1. Field

This disclosure relates to a touch screen panel for a display device, and more particularly, to a touch screen panel with reduced thickness and weight as well as improved yield during a fabrication process.

2. Related Art

Various input devices, such as a keyboard, a mouse, a trackball, a joystick and a digitizer, are provided on various home appliances or communication devices to receive user input. However, in many types of input devices, a user has to learn how to use the input devices, making it difficult for the user to properly operate the products. Furthermore, the input device occupies a separate space, which increases the overall size of the appliances or devices incorporating these input devices. Thus, there has been an increasing demand for simple and convenient input devices.

A touch screen panel is an input device that mitigates or removes such drawbacks in other types of input devices. The touch screen panel allows users to provide user input by directly touching the screen with the users' finger or a pen. The touch screen panel is currently being applied to various display devices due to its simple structure and robust operation.

Two types of touch screen panels are generally in use. One is a resistive type and the other is a capacitive type. The resistive type touch screen panel senses touching and the location of touched portion of the touch screen panel based on a voltage gradient. The voltage gradient depends on resistance in a metal electrode formed on an upper substrate or a lower substrate. In contrast, the capacitive type touch screen panel senses the touching and a touched portion of the touched portion of the touch screen panel based on change of capacitance between electrodes due to touching of the touch screen panel.

SUMMARY

Embodiments relate to providing layers of polymer material on both sides of a substrate on which electrodes are formed. A touch screen panel includes a first polymer layer on a surface of the substrate. A plurality of first electrodes extending in a first direction on the second surface of the substrate is formed on the substrate. A second polymer layer is formed on the first electrodes and the other surface of the substrate. A plurality of second electrodes extend in a second direction on the second polymer layer. The changes in capacitance between the plurality of the second electrodes and the plurality of the first second electrodes are detected for sensing touch on the first polymer layer.

In one embodiment, the second polymer layer is formed with contact holes to expose each of the plurality of first electrodes to a routing wire.

In one embodiment, the routing wire is formed on the second polymer layer and in a corresponding contact hole.

In one embodiment, the touch screen panel further includes a conductive auxiliary layer formed on a portion of the routing wire in the corresponding contact hole.

In one embodiment, the routing wire is made of Al, AlNd, Mo, MoTi, Cu, Cr, Ag or Ag-based alloys.

In one embodiment, the first polymer layer and the second polymer layer are made of the same material.

In one embodiment, the first polymer layer and the second polymer layer are formed of an ultraviolet curable resin or a thermosetting resin.

In one embodiment, the substrate is formed of a polymer material.

In one embodiment, the plurality of first electrodes and the plurality of second electrodes are made of Indium Tin Oxide (ITO), Indium Zinc Oxie (IZO), Gallium-doped Zinc Oxide (GZO), metal nanowires, or carbon-based transparent electrodes.

In one embodiment, each of the plurality of first electrodes has a plurality of intersecting mesh lines, and each of the plurality of second electrodes has a plurality of intersecting mesh lines.

BRIEF DESCRIPTION OF THE DRAWINGS

The teachings of the embodiments can be readily understood by considering the following detailed description in conjunction with the accompanying drawings.

DETAILED DESCRIPTION

Figure 1:
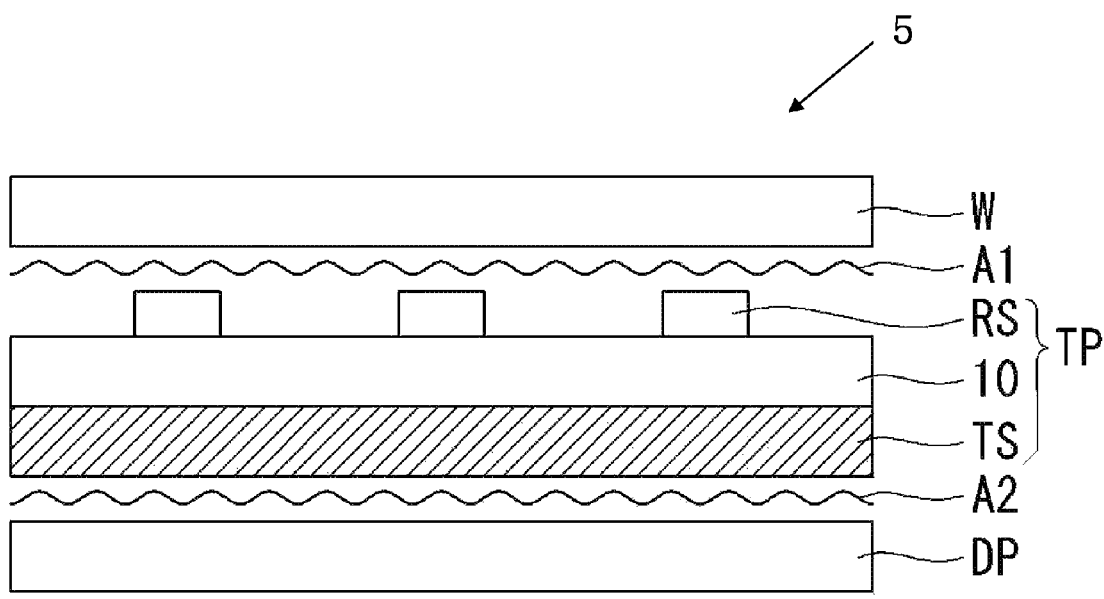
FIG. 1 is a cross-sectional view illustrating a display device assembly including a capacitive type touch screen panel and a display device.

Hereinafter, exemplary embodiments of the present invention will be described in detail with reference to the accompanying drawings. Like reference numerals designate substantially like elements throughout the specification.

FIG. 1 is a cross-sectional view illustrating an example display device assembly 5 including a capacitive type touch screen panel TP and a display device DP. The touch screen panel TP comprises a plurality of driving electrodes TS and a plurality of sensing electrodes RS. The driving electrodes TS are formed on one surface of a transparent substrate 10. Sensing electrodes RS are formed on the other surface of the transparent substrate 10 and intersect with the driving electrodes TS.

A window cover W is attached to the upper surface of the touch screen panel TP where the sensing electrodes RS are formed by first adhesive A1. The window cover W is generally made of glass and affords rigidity to the display device assembly 5. In order to provide sufficient rigidity to the display device assembly 5, the window cover W generally has a certain thickness. The display device DP is attached to the lower surface (where the driving electrodes TS are formed) of the touch screen panel TP by second adhesive A2.

The weight and the thickness of the window cover W and the adhesive the first adhesive A2, however, contribute to the overall weight and the thickness of the display device assembly 5. Moreover, the process of bonding the window cover W to the sensing electrodes RS and the transparent substrate may result in defects, which reduces the yield of the display device assembly 5.

Embodiments relate to providing polymer layers on both sides of a transparent substrate in a capacitance type touch screen panel. By replacing a thicker and heavier window cover with a thinner and lighter two polymer layers, the overall weight of the touch screen panel can be reduced while retaining the rigidity of the touch screen panel. Moreover, the process of forming the polymer layers obviates the need to use adhesive to secure a window cover to the transparent substrate, resulting in fewer defects and increased yield of the touch screen panel.

Figure 2A:
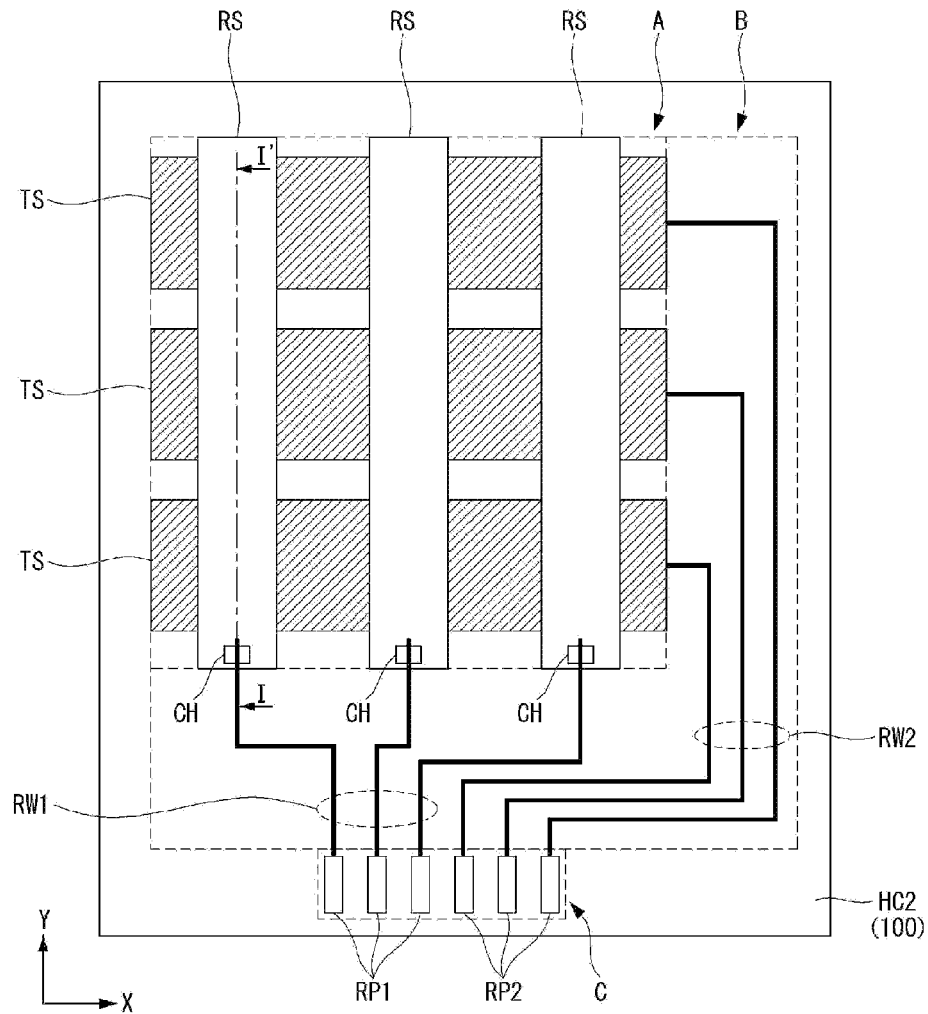
FIG. 2A is a top plan view of a touch screen panel for a display device according to one embodiment.
Figure 2B:
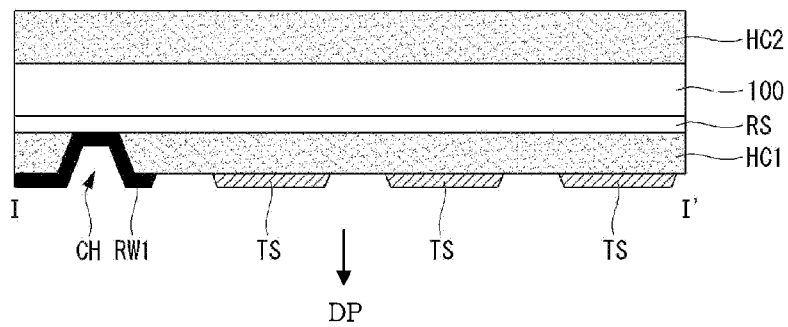
FIG. 2B is a cross-sectional view taken along line I-I' of the touch screen panel of FIG. 2A.

FIG. 2A is a top plan view of a touch screen panel for a display device according to an embodiment. FIG. 2B is a cross-sectional view taken along line I-I' of the touch screen panel of FIG. 2A. The touch screen panel of FIGS. 2A and 2B is divided into three main parts: an electrode part A, a routing wire part B, and a pad part C.

The electrode part A of the touch screen panel may include, among other components, a substrate 100, a plurality of first electrodes RS (hereinafter referred to as "the first electrodes RS") functioning as sensing electrodes, a plurality of second electrodes TS (hereinafter referred to as "the second electrodes TS") functioning as driving electrodes, a polymer layer HC1 (hereinafter referred to as "insulation layer HC1") formed on one surface of the substrate 100, and another polymer layer HC2 (hereinafter referred to as "hard coating layer HC2") formed on the other surface of the substrate 100.

The first electrodes RS are formed on one surface of the substrate 100, and run parallel in a first direction (e.g., Y-axis direction). The plurality of second electrodes TS are formed on the insulation layer HC1 configured to cover the first electrodes RS and run parallel in a second direction (e.g., X-axis direction) that is different from the first direction so that the first electrodes RS and the second electrodes TS intersect. The first and second electrodes RS and TS constituting the touch screen panel are formed on one side of the substrate 100 and electrically insulated from each other by the insulation layer HC1. The hard coating layer HC2 made of the same material as the insulation layer HC1 is formed on the other side of the substrate 100.

The substrate 100 may be formed of a flexible polymer material such as polyethylene terephthalate (PET). The first and second electrodes RS and TS may be formed of a transparent conductive material such as Indium Tin Oxide (ITO), Indium Zinc Oxide (IZO), Gallium-doped Zinc Oxide (GZO), metal nanowires, or carbon-based transparent electrodes. The insulation layer HC1 and the hard coating layer HC2 are formed of an ultraviolet curable resin, such as a typical ultraviolet (UV) curable resin with excellent curability, a nano-silica composite UV curable resin, and an silsesquioxane (SSQ)-based UV curable resin. The typical UV curable resin has a chemical structure as shown in the following Formula (1), the nano-silica composite UV curable resin has a chemical structure as shown in Formula (2), and the SSQ based UV curable resin has a chemical structure as shown in Formula (3).

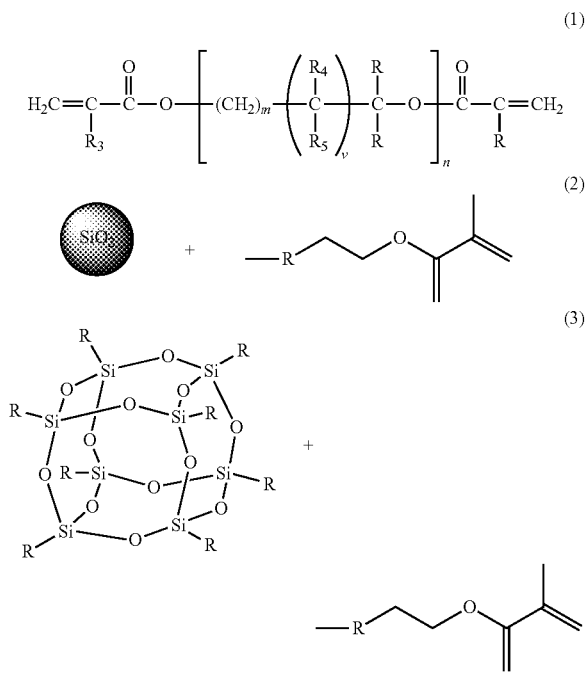

The routing wire part B may include, among other components, a plurality of first routing wires RW1 and a plurality of second routing wires RW2 formed on the insulation layer HC1 at the outer periphery of the electrode part A of the substrate 100. The plurality of first routing wires RW1 are connected to the plurality of first electrodes RS exposed via contact holes CH of the insulation layer HC1. The plurality of second routing wires RW2 are directly connected to the plurality of second electrodes TS formed on the insulation layer HC1. The hard coating layer HC2 is formed on the other surface of the substrate 100 corresponding to the area where the first and second routing wires RW1 and RW2 are formed. The first and second routing wires RW1 and RW2 are formed of metal such as Al, AlNd, Mo, MoTi, Cu, Cr, Ag, and Ag-based alloys.

The pad part C may include, among other components, a plurality of first pads RP1 and a plurality of second pads RP2 formed in the vicinity of the routing wire part B of the substrate 100. Each of the first pads RP1 are connected to an electrode RS through a first routing wire RW1. Each of the plurality of second pads RP2 is connected to a second electrode TS through a second routing wire RW2. The first and second pads RP1 and RP2 are likewise formed of metal such as Al, AlNd, Mo, MoTi, Cu, Cr, Ag, and Ag-based alloys.

Figure 3A:
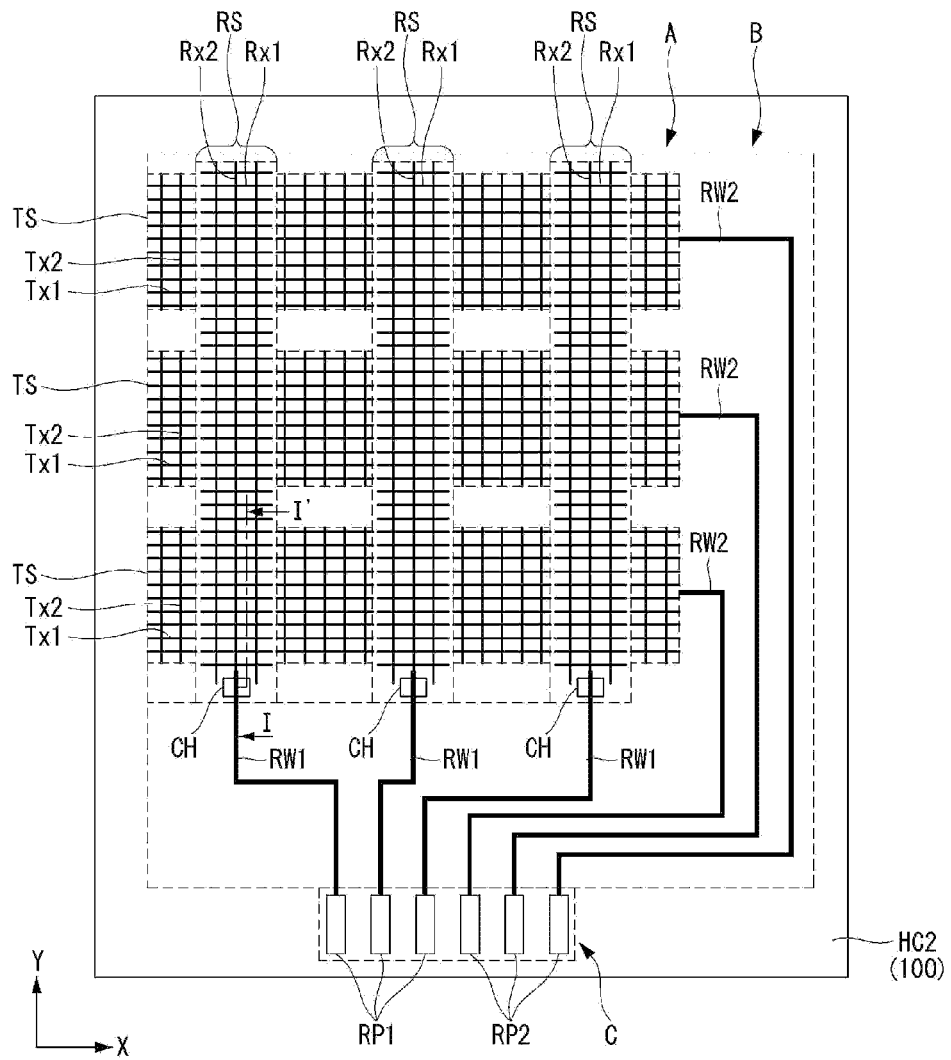
FIG. 3A is a top plan view of a touch screen panel for a display device according to another embodiment.
Figure 3B:
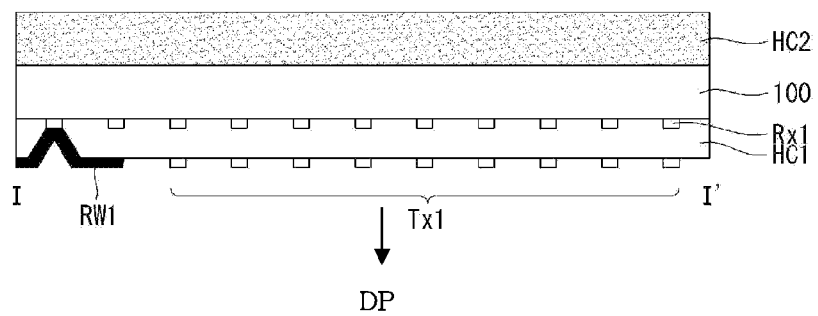
FIG. 3B is a cross-sectional view taken along line I-I' of the touch screen panel of FIG. 3A.

FIG. 3A is a top plan view of a touch screen panel for a display device according to another embodiment. FIG. 3B is a cross-sectional view taken along line I-I' of the touch screen panel of FIG. 3A. The touch screen panel for the display device of FIGS. 3A and 3B is divided up into an electrode part A, a routing wire part B, and a pad part C.

The electrode part A may include, among other components, a plurality of first electrodes RS formed on one surface of a substrate 100, a plurality of second electrodes TS intersecting the plurality of first electrodes RS, with an insulation layer HC1 interposed therebetween, and a hard coating layer HC2 formed on the other surface of the substrate. The first electrodes RS are formed on one surface of the substrate 100, and runs parallel in a first direction (e.g., Y-axis direction). The plurality of second electrodes TS are formed on the insulation layer HC1 configured to cover the first electrodes RS, and run parallel in a second direction (e.g., X-axis direction) to intersect with the first electrodes RS. The first and second electrodes RS and TS constituting the touch screen panel are formed on one side of the substrate 100 and electrically insulated from each other by the insulation layer HC1, and the hard coating layer HC2 made of the same material as the insulation layer HC1 is formed on another side of the substrate 100.

Each of the plurality of first electrodes RS is formed as a mesh including a plurality of horizontal metal lines Rx1 intersecting with vertical metal lines Rx2. Each of the plurality of second electrodes TS is formed as a mesh including a plurality of horizontal metal lines Tx1 intersecting with a plurality of vertical metal lines Tx2.

In the embodiment of FIGS. 3A and 3B, the mesh formed by metal lines of the first and second electrodes RS and TS may be fabricated in various shapes since the mesh patterns can be formed by a combination of electrode lines. Although the mesh pattern of FIG. 3A are shaped as stripes, the mesh pattern may have other shapes such as a triangle, rectangle, diamond, polygon, circle, ellipse, or a dragonfly shape, or a combination there.

In the touch screen panel of FIGS. 3A and 3B, the substrate 100 is formed of a flexible polymer such as PET, and metal lines Rx1 and Rx2 of the first electrodes RS and metal lines Tx1 and TX2 of the second electrodes TS are formed of metal such as Al, AlNd, Mo, MoTi, Cu, Cr, Ag, and Ag-based alloys. As in the embodiment of FIGS. 2A and 2B, the insulation layer HC1 and the hard coating layer HC2 are formed of an ultraviolet curable resin, such as a typical UV curable resin with excellent curability, a nano-silica composite UV curable resin, or an SSQ-based UV curable resin. Alternatively, the insulation layer HC1 and the hard coating layer HC2 may be formed of a thermosetting resin.

The routing wire part B may include, among other components, a plurality of routing wires RW1 and a plurality of second routing wires RW2 which are formed on the insulation layer HC1 at the outer periphery of the electrode part A of the substrate 100. Each of the plurality of first routing wires RW1 is connected to at least one of the metal lines Rx1, Rx2 via contact holes CH of the insulation layer HC1. Each of the plurality of second routing wires RW2 is directly connected to at least one of the metal lines Tx1, Tx2 of the second electrodes TS formed on the insulation layer HC1. The hard coating layer HC2 extending from the electrode part A is formed on the other surface of the substrate 100 where the first and second routing wires RW1 and RW2 are formed. The first and second routing wires RW1 and RW2 are formed of metal such as Al, AlNd, Mo, MoTi, Cu, Cr, Ag, and Ag-based alloys.

The pad part C may include, among other components, a plurality of first pads RP1 and a plurality of second pads RP2 formed in the vicinity of the routing wire part B of the substrate 100. Each of the plurality of first pads RP1 is connected to at least one of the metal lines Rx1 and Rx2 of the first electrodes RS through the plurality of first routing wires RW1. Each of the plurality of second pads RP2 is connected to at least one of the metal lines Tx1, Tx2 of the second electrodes TS through the plurality of second routing wires RW2. The first and second pads RP1 and RP2 are likewise formed of metal such as Al, AlNd, Mo, MoTi, Cu, Cr, Ag, and Ag-based alloys.

In the touch screen panel of FIGS. 3A and 3B, touch electrodes are formed of metal with low resistivity. Thus, it is possible to reduce the resistance and capacitance of the touch screen panel. This reduces the time constant, thus achieving improved touch sensitivity. Also, this gives an advantage when making the size of the touch screen panel larger.

Figure 4A:
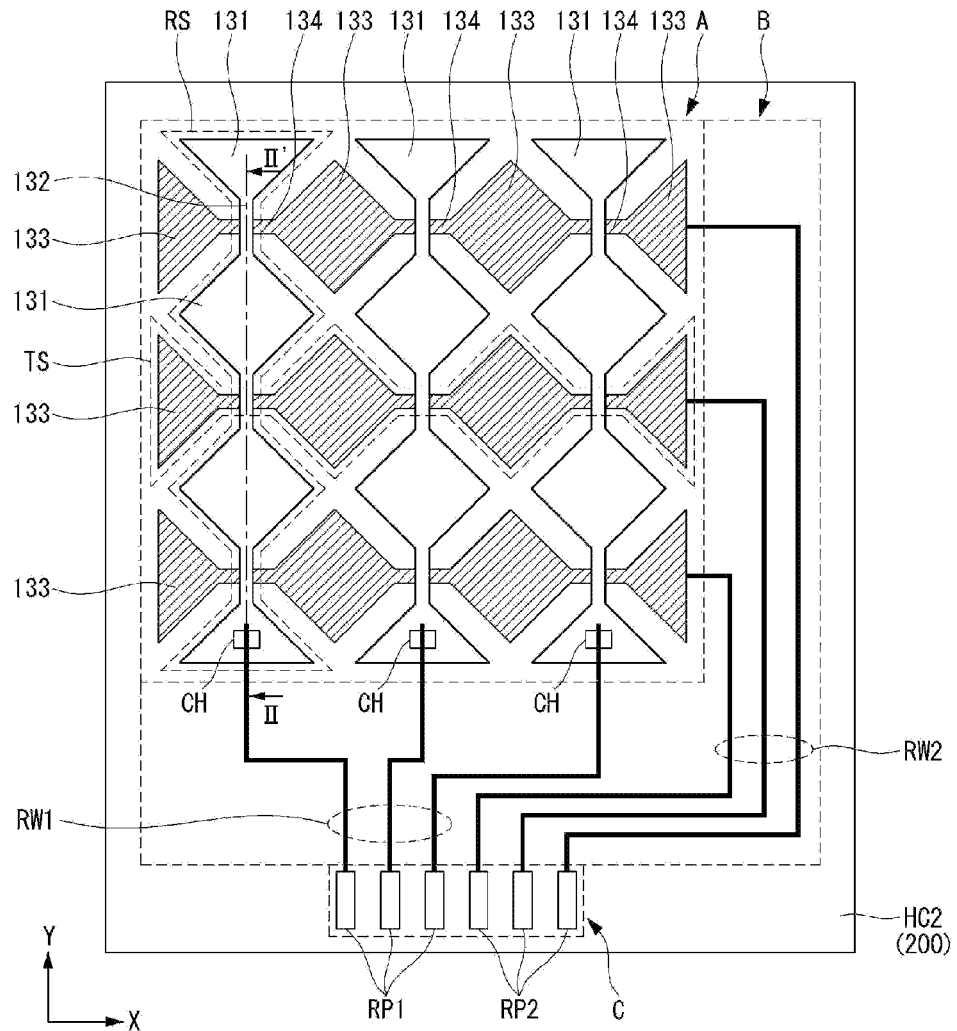
FIG. 4A is a top plan view of a touch screen panel for a display device according to another embodiment.
Figure 4B:
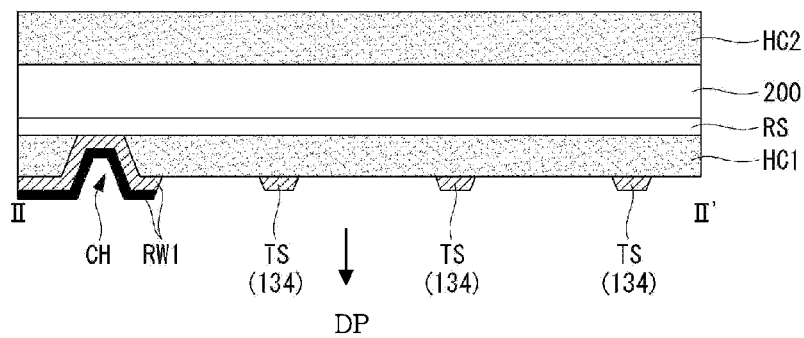
FIG. 4B is a cross-sectional view taken along line II-II' of the touch screen panel of FIG. 4A.

FIG. 4A is a top plan view of a touch screen panel for a display device according to another embodiment. FIG. 4B is a cross-sectional view taken along line II-II' of the touch screen panel of FIG. 4A. The touch screen panel for the display device of FIGS. 4A and 4B is divided up into an electrode part A, a routing wire part B, and a pad part C.

The electrode part A may include, among other components, a plurality of first electrodes RS formed on one surface of a substrate 200, a plurality of second electrodes TS intersecting with the plurality of first electrodes RS, with an insulation layer HC1 interposed therebetween, and a hard coating layer HC2 formed on the other surface of the substrate.

The plurality of first electrodes RS are formed on the substrate 200 and extend in a first direction (e.g., Y-axis direction). Each of the first electrodes RS may be formed to have first nodes 131 shaped as a triangle, rectangular, diamond, polygonal, circular, elliptical shape or a combination thereof. First connecting portions 132 connect neighboring electrode nodes 131. The first nodes 131 and the first connecting portions 132 collectively form a first electrode RS. Although the first electrodes RS in FIG. 4A function as sensing electrodes, they may also be configured as driving electrodes.

The plurality of second electrodes TS are formed on the insulation layer HC1 configured to cover the first electrodes RS, and extend in a second direction (e.g., X-axis direction) to intersect with the first electrodes RS. Each of the second electrodes TS includes second nodes 133 shaped as triangular, rectangular, diamond, polygonal, circular, or elliptical shape, or a combination thereof. Similar to the first electrode patterns 131 and the first connecting portions 132, second connecting portions 134 connect neighboring second nodes 133. The second nodes 133 and second connecting portions 134 collectively form a second electrode TS. Although the plurality of second electrodes TS in FIG. 4A function as sensing electrodes, they may be also function as driving electrodes. If the plurality of first electrodes RS function as sensing electrodes, the plurality of second electrodes TS function as driving electrodes. If the plurality of first electrodes RS function as driving electrodes, the plurality of second electrodes TS function as sensing electrodes.

The first electrodes RS and second electrodes TS are formed on the same side of the substrate 200 and are electrically insulated from each other by the insulation layer HC1. The hard coating layer HC2 made of the same material as the insulation layer HC1 is formed on the other side of the substrate 200.

As in the embodiment of FIGS. 2A and 2B, the substrate 200 may be formed of a flexible plastic material such as PET. The first and second electrodes RS and TS may be formed of a transparent conductive material such as ITO, IZO, GZO, metal nanowires, or carbon-based transparent electrodes. The insulation layer HC1 and the hard coating layer HC2 are formed of an ultraviolet curable resin, such as a typical UV curable resin with excellent curability, a nano-silica composite UV curable resin, or an SSQ-based UV curable resin.

The routing wire part B may include, among other components, a plurality of routing wires RW1 and a plurality of second routing wires RW2 which are formed on the insulation layer HC1 at the outer periphery of the electrode part A of the substrate 200. The plurality of first routing wires RW1 are connected to the plurality of first electrodes RS via contact holes CH of the insulation layer HC1, and the plurality of second routing wires RW2 are directly connected to the plurality of second electrodes TS formed on the insulation layer HC1. The hard coating layer HC2 extending from the electrode part A is formed on the other surface of the substrate 200 where the first and second routing wires RW1 and RW2 are formed. The first and second routing wires RW1 and RW2 are formed of metal such as Al, AlNd, Mo, MoTi, Cu, Cr, Ag, and Ag-based alloys.

The pad part C may include, among other components, a plurality of first pads RP1 and a plurality of second pads RP2 formed in the vicinity of the routing wire part B of the substrate 200. Each of the plurality of first pads RP1 is connected to a first electrode RS through a first routing wire RW1. Each of the plurality of second pads RP2 is connected to a second electrode TS through a second routing wire RW2. The first and second pads RP1 and RP2 may be formed of metal such as Al, AlNd, Mo, MoTi, Cu, Cr, Ag, and Ag-based alloys.

Figure 5A:
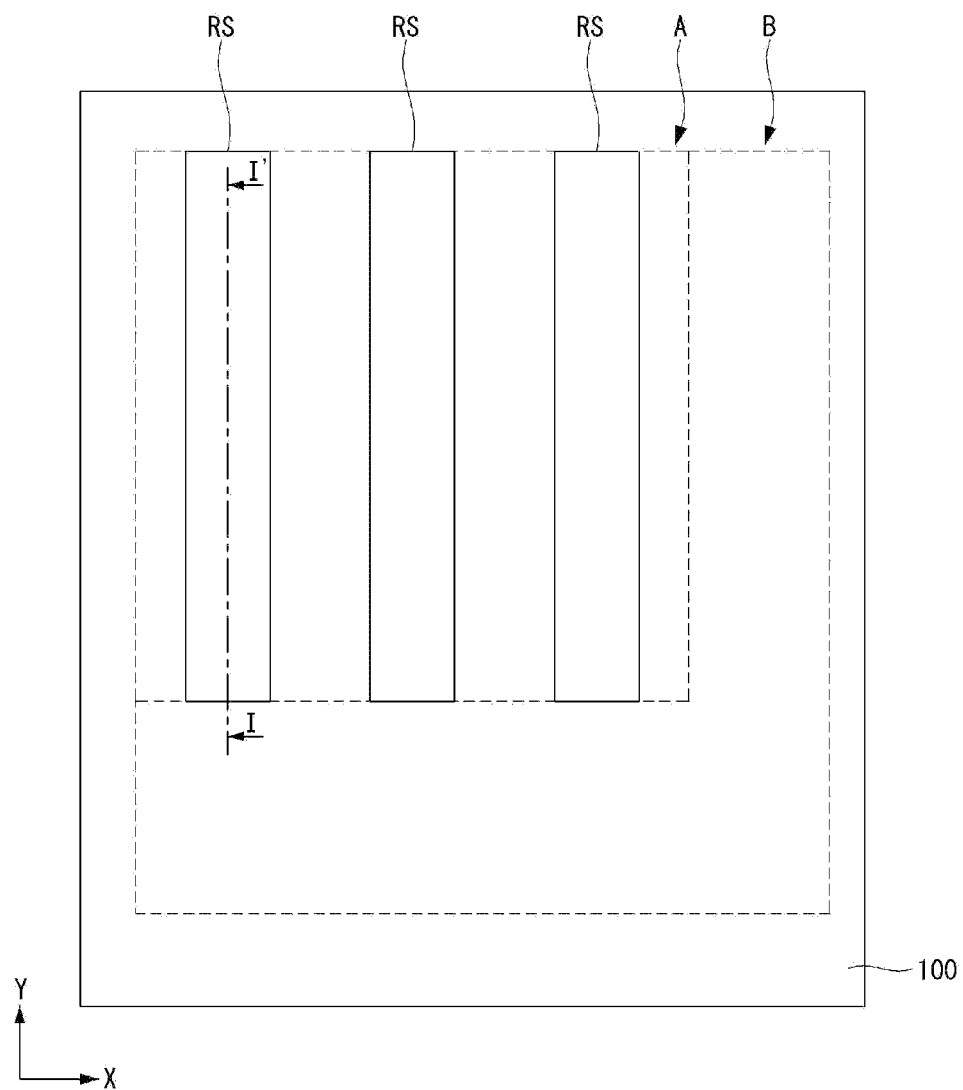
FIG. 5A is a top plan view illustrating a process for forming driving electrodes of the touch screen panel for the display device according to the embodiment of FIGS. 2A and 2B.
Figure 5B:
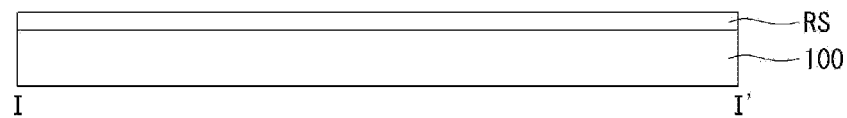
FIGS. 5B and 5C are cross-sectional views taken along line I-I' of FIG. 5A, illustrating a process for forming sensing electrodes of the touch screen panel for the display device, according to one embodiment.
Figure 5C:
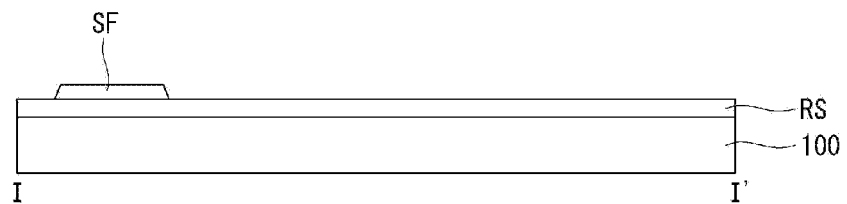

FIG. 5A is a top plan view illustrating a process for forming driving electrodes of the touch screen panel for the display device according to the embodiment of FIGS. 2A and 2B. FIGS. 5B and 5C are cross-sectional views taken along line I-I' of FIG. 5A, illustrating a process for forming sensing electrodes of the touch screen panel for the display device according to the embodiment of FIGS. 2A and 2B. A first transparent conductive layer is formed on one surface of the substrate 100 made of a polymer material such as PET. Then, a plurality of first electrodes RS or sensing electrodes RS (hereinafter, referred to as first electrodes) are patterned to run parallel in a first direction (e.g., Y-axis direction) as shown in FIG. 5A. In one embodiment, a plurality of first electrodes RS may be formed on one surface of the substrate 100 by injecting metal using an inkjet apparatus.

As shown in FIG. 5C, a sacrificial film SF is formed in a predetermined area of the first electrode RS. The sacrificial film SF is formed at a position where contact holes are to be formed in an insulation layer to prevent damage of the first electrode RS in the formation of the contact holes. It should be noted that the sacrificial film SF may be omitted.

Figure 6A:
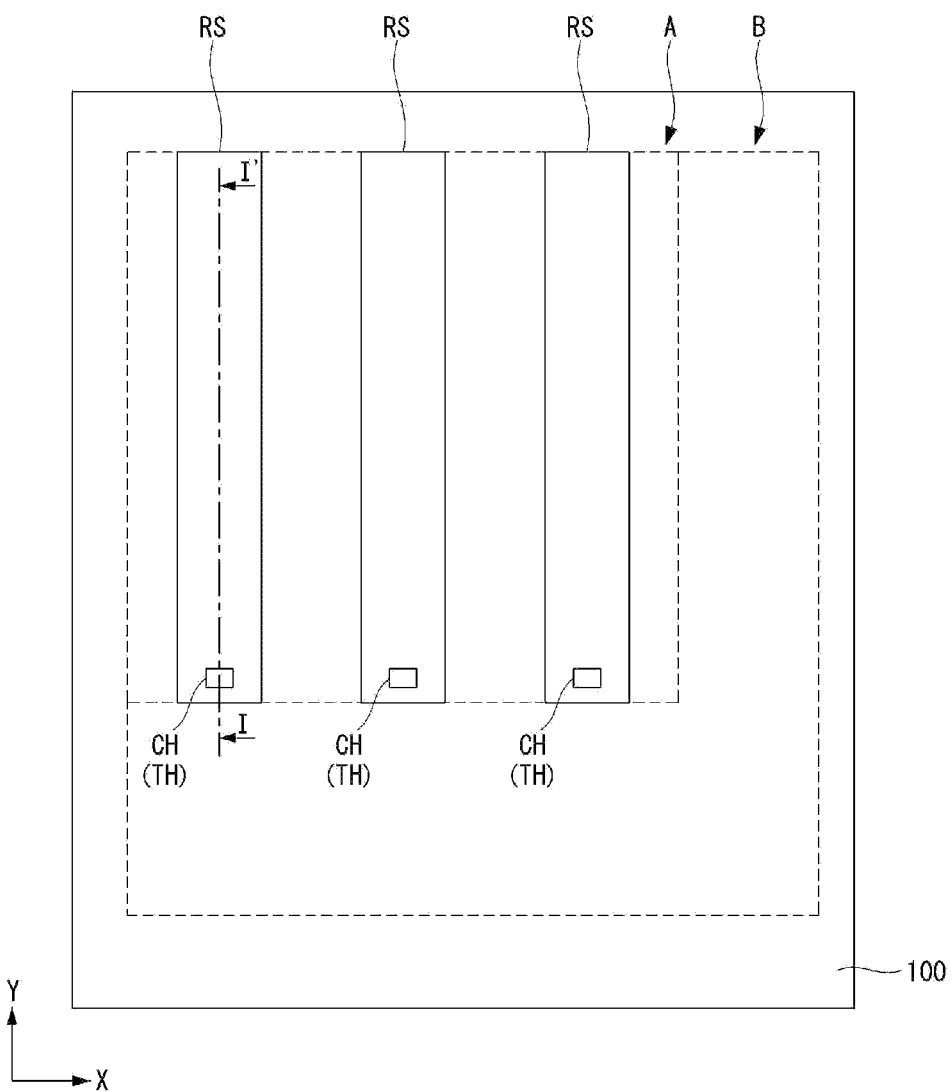
FIG. 6A is a top plan view illustrating a process for forming an insulation layer having first contact holes exposing portions of the sensing electrodes of the touch screen panel, according to one embodiment.
Figure 6B:
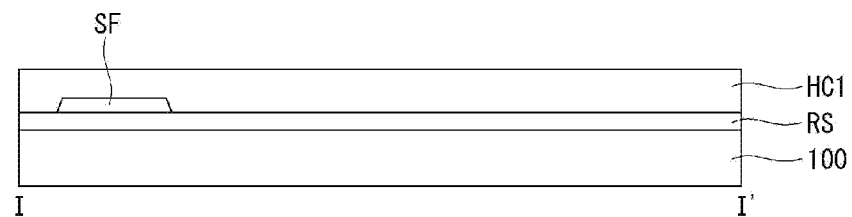
FIGS. 6B through 6D are cross-sectional views taken along line I-I' of FIG. 6A, illustrating the process for forming an insulation layer having first contact holes exposing portions of the sensing electrodes of the touch screen panel, according to one embodiment.
Figure 6C:
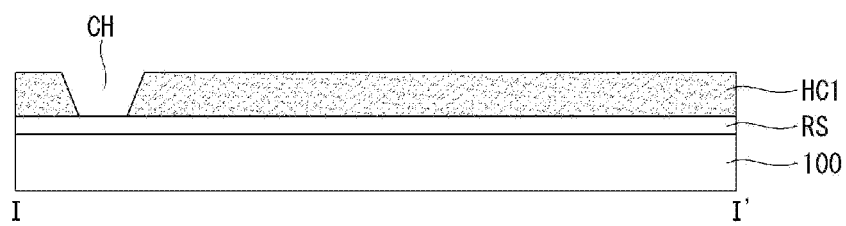
Figure 6D:
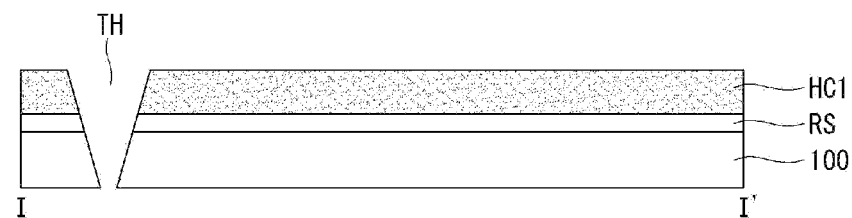

FIG. 6A is a top plan view illustrating a process for forming an insulation layer having first contact holes exposing portions of the sensing electrodes of the touch screen panel for the display device according to the embodiment of FIGS. 2A and 2B. FIGS. 6B through 6D are cross-sectional views taken along line I-I' of FIG. 6A, illustrating the process for forming an insulation layer having first contact holes exposing portions of the sensing electrodes of the touch screen panel for the display device according to the embodiment of FIGS. 2A and 2B.

An insulation layer HC1 having contact holes CH is formed on an entire surface of the substrate 100 where first electrodes RS are formed so that the portions of the first electrodes RS are exposed. Specifically, as shown in FIG. 6B, an ultraviolet curable resin, such as a typical UV curable resin with excellent curability, a nano-silica composite UV curable resin, or an SSQ-based UV curable resin, or a thermosetting resin are coated as the insulation layer on the front surface of the substrate 100 where the first electrodes RS and a sacrificial layer SF are formed.

As shown in FIG. 6C, the contact holes CH are formed to expose portions of the first electrodes RS, or through holes TH that passing through the insulation layer, the first electrodes, and the substrate 100 are formed. FIG. 6C shows that the sacrifice film SF is removed in the formation of the contact holes CH or through holes TH. In the case of forming the through holes TH as shown in FIG. 6D, the sacrifice film SF may not be initially formed.

Although a photolithography method may be used to form the contact holes CH or through holes TH in the insulation layer HC1. It is also possible to form the contact holes CH in the insulation layer HC1 by using a $CO_2$ laser drill method, a screen printing method, an imprinting method, a dry film resist lamination method, and an electrohydro-dynamic (EHD) method.

Figure 7A:
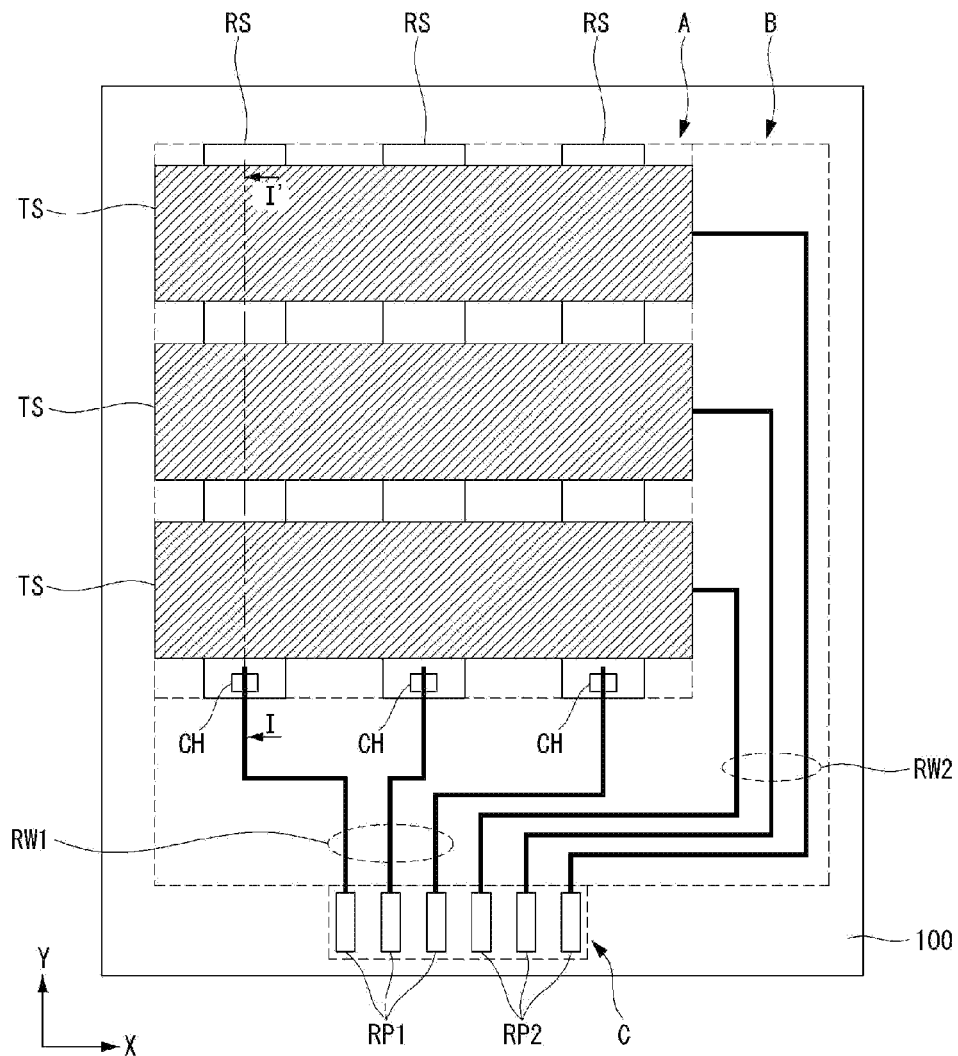
FIG. 7A is a top plan view illustrating a process for forming first routing wires, driving electrodes, second routing wires, and a hard coating layer of the touch screen panel for the display device according to one embodiment.
Figure 7B:
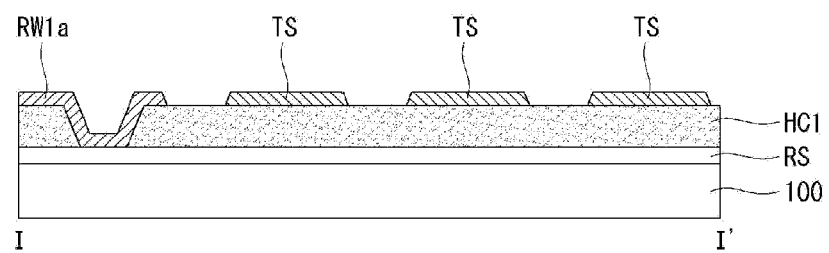
FIGS. 7B and 7C are cross-sectional views taken along line I-I' of FIG. 7A, illustrating a process for forming the first routing wires, driving electrodes, and second routing wires of the touch screen panel for the display device according to one embodiment.
Figure 7C:
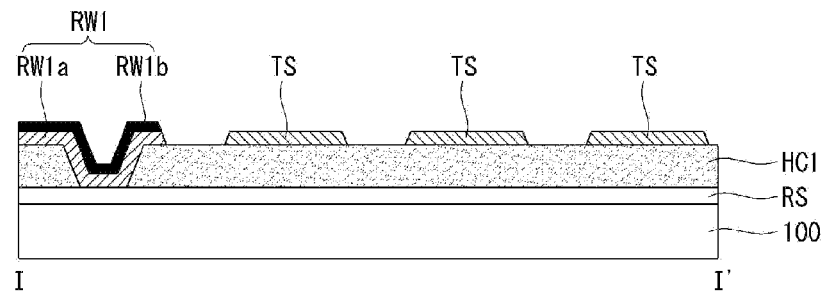

FIG. 7A is a top plan view illustrating a process for forming first routing wires, driving electrodes, second routing wires, and a hard coating layer of the touch screen panel for the display device according to the embodiment of FIGS. 2A and 2B. FIGS. 7B and 7C are cross-sectional views taken along line I-I' of FIG. 7A, illustrating a process for forming the first routing wires, driving electrodes, and second routing wires of the touch screen panel for the display device according to the embodiment of FIGS. 2A and 2B. A first conductive layer made of metal such as Al, AlNd, Mo, MoTi, Cu, or Cr is deposited on an insulation layer CH1 having contact holes CH, and the first conductive layer is patterned using a photolithography process using a mask. As a result, a plurality of first routing wires RW1 respectively connected to a plurality of first electrodes RS via the contact holes CH and a plurality of first pads RP1 respectively connected to the plurality of first routing wires RW1 are formed on the insulation layer HC1 as shown in FIGS. 7A and 7B.

Referring to FIGS. 7A through 7C, a second transparent conductive layer is formed on the insulation layer HC1 configured to cover the first electrodes RS, and then patterned. As a result, a plurality of second electrodes TS are formed along a second direction (e.g., X-axis direction) intersecting with a first direction (e.g., Y-axis direction). The first layer RW1a of the first routing wires RW1 contacting the first electrodes RS exposed via the contact holes CH, a first layer (not shown) of the first pads RP1 extending from the first layer of the first routing wires, a first layer (not shown) of second routing wires RW2 extending from the second electrodes TS, and a first layer (not shown) of second pads RP2 extending from the first layer (not shown) of the second routing wires RW2 are also formed.

Figure 8A:
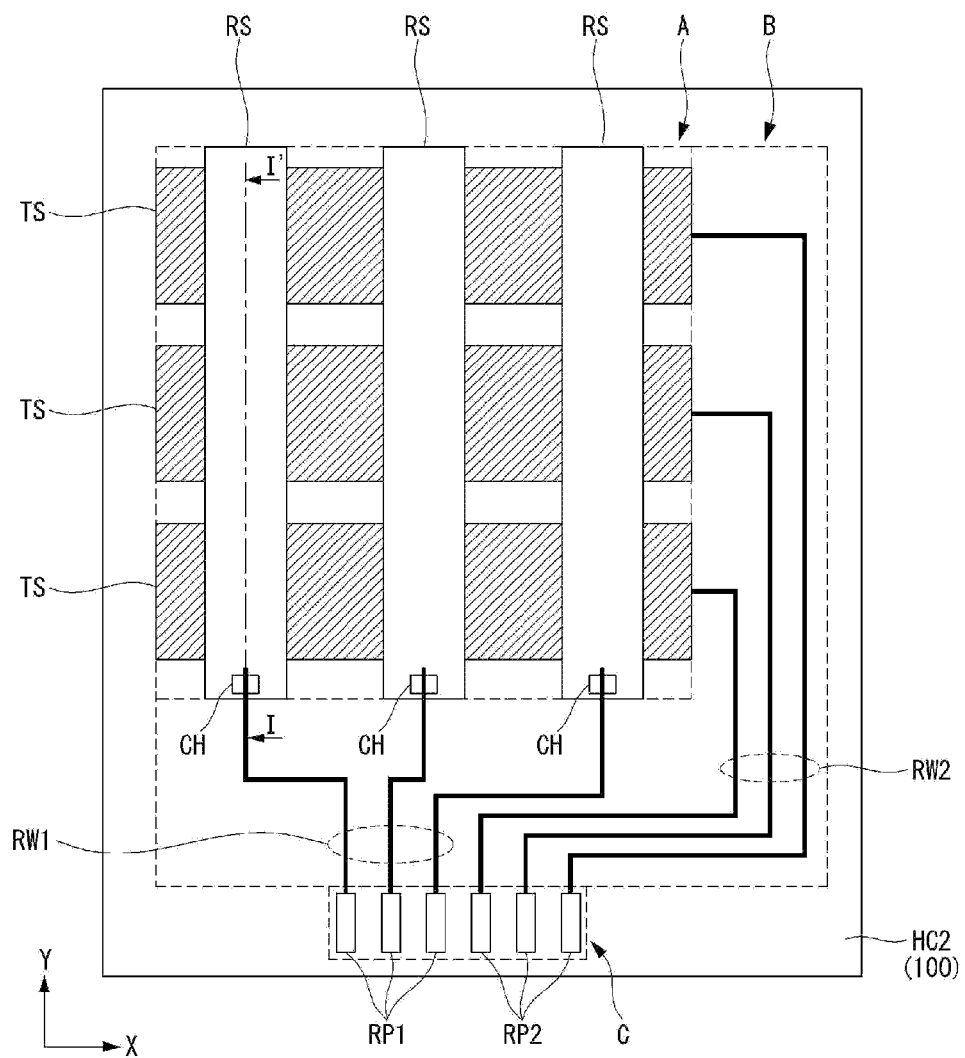
FIG. 8A is a top plan view illustrating a process for forming a hard coating layer of the touch screen panel for the display device according to one embodiment.
Figure 8B:
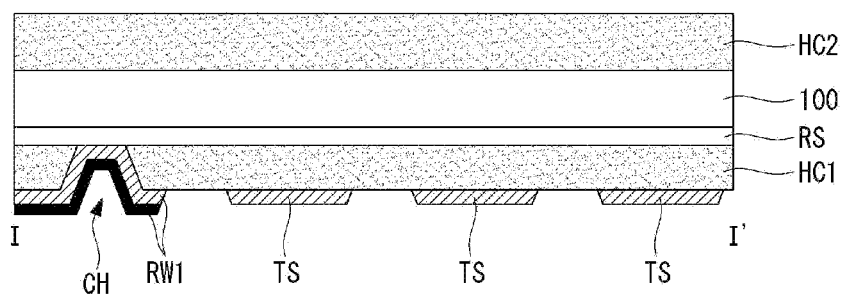
FIG. 8B is a cross-sectional view taken along line I-I' of FIG. 8, illustrating the process for forming a hard coating layer of the touch screen panel for the display device according to one embodiment.

FIG. 8A is a top plan view illustrating a process for forming a hard coating layer of the touch screen panel, according to one embodiment. FIG. 8b is a cross-sectional view taken along line I-I' of FIG. 8, illustrating the process for forming a hard coating layer of the touch screen panel, according to one embodiment. The substrate 100 where the second electrodes TS are formed is turned upside down, and then a hard coating layer HC2 is formed on the other surface of the substrate 100. The hard coating layer HC2 is formed of the same material as the insulation layer HC1.

Figure 9:
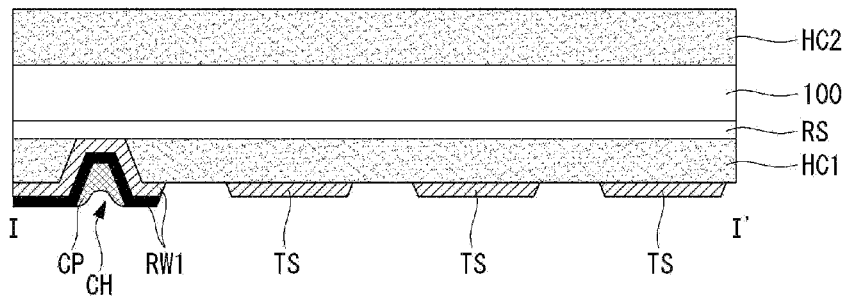
FIG. 9 is a cross-sectional view of a conductive auxiliary layer additionally formed after contact holes are formed by the process of FIGS. 6B through 6D, according to one embodiment.

FIG. 9 is a cross-sectional view of a conductive auxiliary layer CP additionally formed after contact holes are formed by the process described above with reference to FIGS. 6B through 6D. The conductive auxiliary pattern CP may be formed by filling metal ink in the contact holes CH or through holes TH by a screen printing method, a dispensing method, an inkjet method, or an electroplating method, and may be formed of Ag, Cu, etc. In general, a bur may be formed in the process of forming the contact holes CH or through holes TH. When the bur is formed, moisture may permeate along interfaces of the contact holes CH or through holes TH. Such moisture permeation may cause corrosion or cutoff of the first routing wires RW1, thereby deteriorating the contact performance of the first routing wires RW1 and first electrodes RS. The conductive auxiliary pattern CP is formed on the first routing wires RW1 formed in the contact holes CH or through holes TH, and this conductive auxiliary pattern CP can prevent moisture permeation from the outside. Consequently, the auxiliary layer CP prevents deterioration of contact performance due to penetration of moisture.

The process described above with reference to FIGS. 5A through 9 can be applied to the embodiment of FIGS. 3A and 3B except for the difference that the first and second electrodes in the embodiment of FIGS. 3A and 3B uses metal line electrodes. Further, the process described above with reference to FIGS. 5A through 9 can be applied to the embodiment of FIGS. 4A and 4B except for the difference that the first electrodes and second electrodes include nodes and connection portions.

Embodiments advantageously form polymer material on both sides of a substrate on which driving electrodes and sensing electrodes are formed. By forming layers of polymer material on both sides of the substrate, the rigidity of the touch panel can be increased while avoiding increase in thickness and weight due to the presence of a window cover used in conventional touch screen panels. Moreover, adhesive for bonding the window cover can be omitted, further decreasing the overall thickness and weight of the touch panel.

The touch screen panel according to an exemplary embodiment of the present invention may be applied to displays including a liquid crystal display LCD, a field emission display FED, a plasma display panel PDP, an electroluminescence device EL, and an electrophoretic display.

While the invention has been described with respect to a limited number of embodiments, those skilled in the art, having benefit of the above description, will appreciate that other embodiments can be devised which do not depart from the scope of the invention as disclosed herein. Accordingly, the scope of the invention should be limited only by the attached claims.

What is claimed is:

1. A touch screen panel comprising:
   a substrate having a first surface and a second surface at a side opposite to the first surface;
   a first polymer layer on the first surface of the substrate;
   a plurality of first electrodes extending in a first direction on the second surface of the substrate;
   a second polymer layer on the plurality of first electrodes and the second surface of the substrate, the second polymer layer having contact holes to expose each of the plurality of first electrodes;
   a plurality of second electrodes, insulated from the plurality of first electrodes by the second polymer layer, the plurality of second electrodes extending in a second direction on the second polymer layer;
   a plurality of routing wires, each of the plurality of routing wires disposed on the second polymer layer and having a portion disposed in a corresponding contact hole formed in the second polymer layer to electrically connect to a corresponding first electrode, the portion of the routing wire comprising at least a first layer and a second layer, the first layer comprising a same transparent conductive material as the plurality of second electrodes, and the second layer comprising a different material than the first layer, and wherein the first layer is positioned between the second layer and the corresponding first electrode; and
   a plurality of conductive auxiliary patterns on the routing wires and inside each corresponding contact hole, in contact with the second layer of the portion of each of the plurality of routing wires disposed in the corresponding contact hole, respectively.

2. The touch screen panel of claim 1, wherein the second layer of the portion of the routing wire is made of metal selected from the group consisting of Al, AlNd, Mo, MoTi, Cu, Cr, Ag, and Ag-based alloys.

3. The touch screen panel of claim 1, wherein the first polymer layer and the second polymer layer are made of a same material.

4. The touch screen panel of claim 1, wherein the first polymer layer and the second polymer layer are formed of an ultraviolet curable resin or a thermosetting resin.

5. The touch screen panel of claim 1, wherein the substrate is formed of a polymer material.

6. The touch screen panel of claim 1, wherein the first layer of the portion of the routing wire and the plurality of second electrodes are made of a transparent conductive material selected from the group consisting of ITO (Indium Tin Oxide), IZO (Indium Zinc Oxide), GZO (Gallium-doped Zinc Oxide), metal nanowires, and carbon-based transparent electrodes.

7. The touch screen panel of claim 1, wherein each of the plurality of first electrodes has a plurality of intersecting mesh lines, and each of the plurality of second electrodes has a plurality of intersecting mesh lines.

8. The touch screen panel of claim 7, wherein the plurality of intersecting mesh lines of the plurality of first electrodes and the plurality of second electrodes shaped as a triangle, rectangle, diamond, polygon, ellipse or a dragonfly shape.

9. The touch screen panel of claim 1, further comprising a plurality of pads formed on the first surface of the substrate, wherein each of the plurality of pads are electrically connected to each of the plurality of first electrodes through each of the plurality of routing wires.

10. The touch screen panel of claim 9, wherein each of the plurality of pads are made of metal selected from the group consisting of Al, AlNd, Mo, MoTi, Cu, Cr, Ag, and Ag-based alloys.

11. The touch screen panel of claim 1, wherein the plurality of first electrodes may have first nodes shaped as a triangle, rectangle, diamond, polygonal, circle or ellipse, and the plurality of second electrodes may have second nodes shaped as a triangle, rectangle, diamond, polygon, circle or ellipse.

12. The touch screen panel of claim 1, wherein the plurality of conductive auxiliary patterns comprises Ag.

* * * * *